United States Patent  
Bette

(10) Patent No.: US 6,720,785 B2
(45) Date of Patent: Apr. 13, 2004

(54) INTEGRATED CIRCUIT WITH TEST MODE, AND TEST CONFIGURATION FOR TESTING AN INTEGRATED CIRCUIT

(75) Inventor: Alexander Bette, Burlington, VT (US)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 09/883,822

(22) Filed: Jun. 18, 2001

(65) Prior Publication Data

US 2002/0008235 A1 Jan. 24, 2002

(30) Foreign Application Priority Data

Jun. 16, 2000 (DE) .......................................... 100 29 835

(51) Int. Cl.[7] ............................................. G01R 31/26
(52) U.S. Cl. ....................................... 324/765; 324/763
(58) Field of Search ............................. 324/73.1, 73 R, 324/73 PC, 158.1, 158 T, 754, 763, 765, 766; 371/22.1, 22.5, 22.6, 20; 438/17, 18; 714/30, 733; 257/136

(56) References Cited

U.S. PATENT DOCUMENTS

| 4,743,841 A | * | 5/1988 | Takeuchi | ................. 324/73 R |
| 5,130,645 A | * | 7/1992 | Levy | ..................... 324/158 R |
| 5,289,118 A | | 2/1994 | Crisafulli | |
| 5,298,433 A | | 3/1994 | Furuyama | |
| 5,565,801 A | | 10/1996 | Ernst | |
| 5,666,314 A | | 9/1997 | Akaogi et al. | |
| 5,790,459 A | | 8/1998 | Roohparvar | |
| 5,796,746 A | | 8/1998 | Farnworth et al. | |
| 5,965,902 A | | 10/1999 | Beffa | |
| 6,255,837 B1 | * | 7/2002 | Habersetzer et al. | ........ 324/763 |

FOREIGN PATENT DOCUMENTS

| DE | 198 08 525 A1 | 9/1999 |
| DE | 199 36 606 C1 | 10/2000 |
| WO | WO 91/12706 | 8/1991 |

* cited by examiner

*Primary Examiner*—Kamand Cuneo
*Assistant Examiner*—Trung Nguyen
(74) *Attorney, Agent, or Firm*—Laurence A. Greenberg; Werner H. Stemer; Ralph E. Locher

(57) ABSTRACT

During a function test on an integrated circuit, the integrated circuit is connected to an automatic test machine. A connection pad provided exclusively just for supplying an additional or programming voltage is connected to a voltage connection of the automatic test machine. A switch that can be switched in the test mode connects the connection pad in order to actuate irreversibly programmable switches. This keeps down the level of complexity for supplying a programming voltage for the switching elements.

5 Claims, 1 Drawing Sheet

INTEGRATED CIRCUIT WITH TEST MODE, AND TEST CONFIGURATION FOR TESTING AN INTEGRATED CIRCUIT

BACKGROUND OF THE INVENTION

Field of the Invention

The invention relates to an integrated circuit having connection areas for poles of a supply voltage, which can be operated in a test mode and a normal mode. The invention also relates to a test configuration for testing such a circuit.

At the end of manufacture of an integrated circuit, the operation of the circuit is tested. To this end, the integrated circuit is connected to an automatic test machine. The circuit is supplied with a supply voltage by the automatic test machine and is supplied with signals on the basis of a prescribed test program. Depending on the type of circuit, it is also necessary to impress voltages that are different than the operating supply voltage.

Semiconductor memories, in particular, have redundant structures, so that faulty components or memory cells can be replaced thereby. Instead of the faulty structure, the redundant structure is connected. The structures are changed over using irreversible switches, so-called fuses. To program a fuse, a relatively high voltage situated outside the operating voltage range is required. By way of example, the operating voltage of the semiconductor memory is 3 volts; and 6 volts is required for programming the fuse.

The automatic test machine has respective connections for the supply voltage and the signals that are to be processed. In normal automatic test machines, the connections for one or more supply voltages can be controlled independently of one another and can deliver voltages of, largely, any desired level. In contrast, although the signal state of the connections provided for supplying signals to the circuit which is to be tested can be controlled individually, the level of the signal voltage can be set only on a group basis for a multiplicity of signal connections. For supplying the elevated voltage required for programming a fuse, it is not advisable to use a signal connection, since the entire group of signal connections on the tester would then have to carry the elevated voltage. For the semiconductor memory that is to be tested, there would be an excessive voltage load on the signal connections, so that the circuit would be subject to unnecessarily high loading stress and aging stress. In the worst case, semiconductor structures could be destroyed. On the other hand, a voltage generator could, admittedly, be provided within the semiconductor memory. This would require an increased surface area to be taken up on the semiconductor chip.

SUMMARY OF THE INVENTION

It is accordingly an object of the invention to provide an integrated circuit with a test mode, and a test configuration for testing the integrated circuit which overcomes the above-mentioned disadvantages of the prior art devices of this general type, in which a further supply voltage can be supplied in the test mode with little complexity.

With the foregoing and other objects in view there is provided, in accordance with the invention, an integrated circuit. The integrated circuit contains first connection areas each connecting to one of two poles of a supply voltage and a switch having a first input receiving a test signal for actuating the switch so that the switch is on in a test mode and off during a normal mode. In addition, the switch has a second input for receiving an impressed voltage and an output. A second connection area is connected exclusively to the switch and provides the impressed voltage. A functional unit having elements which can be irreversibly switched by impressing the impressed voltage, is provided. The functional unit has an input connected to the output of the switch for receiving the impressed voltage.

As regards the integrated circuit, the object is achieved by the integrated circuit containing first connection areas, each for one of two poles of a supply voltage, a second connection area, which, in terms of signals, is connected exclusively to just one switch. The switch can be actuated by a test signal, so that the switch is on in a test mode of the circuit and the switch is off in a normal mode. A functional unit having elements which can be irreversibly switched by impressing a voltage and whose connection for impressing the voltage is coupled to the switch.

A test configuration for testing the integrated circuit contains an automatic test machine that has connections for supplying one pole of a supply voltage and a number of connections for supplying a plurality of signals containing states. The integrated circuit is as mentioned above in which the second connection area is connected to a connection for supplying one pole of a supply voltage of the automatic test machine.

Thus, the integrated circuit is provided with an additional connection area that is used just for supplying the supply voltage that is different than the operating supply voltage in the test mode. In integrated circuits, particularly semiconductor memories, depending on the size of the package, connection pins or pads are often provided which have no function during normal operation. They can therefore be used specifically for the test mode. Admittedly, efforts are made in integrated circuits to save chip surface area and, in particular, also connections. However, if connection areas can still readily be disposed on free areas of the chip and, on account of the standardized size, the package has connection pins that are connected without any function during normal operation, such a connection area and the connection pin connected thereto can be used specifically just for the test mode in order to supply a further supply voltage. Such a supply pin that can be used just for the test mode has the advantage that it can be connected to a dedicated supply voltage connection in the automatic test machine. Such a connection of the automatic test machine can be set individually at the level of the supply voltage to be produced. It is therefore fundamentally different than a signal connection whose signal level can generally be set only on a group basis.

It is also necessary for the connection area to be reliably and completely disconnected during normal operation. To this end, a switch is provided that is on in the test mode, so that the further supply voltage which can be supplied is routed into the interior of the circuit, e.g. in order to program the fuses, but is reliably off in normal operation, so that any signal which is present is not routed into the interior of the circuit. If appropriate, the datasheet for the integrated circuit should expressly state that the relevant connection pin on the package has no function during normal operation, but nevertheless has some wiring. In particular, the connection area on the chip needs to be provided with suitable circuits for discharging ESD pulses (ESD: Electrostatic Discharge).

The additional supply voltage or test voltage that can be additionally supplied is different than the normal operating voltage. It can be lower or preferably higher, i.e. greater in terms of magnitude than the supply voltage in normal operation. The additional supply voltage is used for programming an irreversibly switchable switching element. Such switching elements are fuses, for example, which are conductive in the initial state and represent an open circuit in the state that is programmed once, irreversibly. Alternatively, antifuses are also conceivable, which represent an open circuit in the initial state and are conductive in the programmed state. Such fuses or antifuses are used in order to impress signal states on memory elements when the integrated circuit is initialized. In semiconductor memories, such fuses are used to connect signal paths for replacing faulty components with fault-free components present in redundant form. By way of example, faulty memory cells or groups of memory cells are replaced with memory cells or groups of memory cells present in redundant form.

In accordance with an added feature of the invention, one of the elements forms a conducting current path in an initial state and forms an unloaded current path when the impressed voltage has been impressed.

In accordance with another feature of the invention, the impressed voltage required for irreversibly switching the elements is different than the supply voltage. More specifically, a magnitude of the impressed voltage is greater than that of the supply voltage.

A test configuration for testing the integrated circuit as described above, in particular an integrated semiconductor memory, contains an automatic test machine that has connections both for supplying the supply voltage and for supplying the operating signals. Supply voltage connections can be controlled individually by the automatic machine in terms of the level of the voltage to be impressed. Although the respective signal state of the operating signals can be controlled individually, the level for the respective states can be set only on a signal group basis. A supply voltage connection of the tester is therefore connected to the additional supply voltage connection, used for programming the fuse, of the integrated circuit that is to be tested. During a test procedure, a multiplicity of integrated circuits are usually tested. These are disposed on a test board. The additional supply connections for providing the impressed voltage for programming the fuses are connected to one another for the multiplicity of integrated circuits to be tested. Therefore, the additional voltage impressed is applied to each relevant voltage pin on all the integrated circuits to be tested. Depending on the further signals which can be supplied to the respective circuits, a signal path is then connected within the chips at the appropriate time in order to supply the elevated impressed voltage to an appropriate fuse in order to program it. Furthermore, the additional supply voltage connection can be provided in order to supply any desired voltage, for example as an impressed reference voltage, to the integrated circuits that are to be tested.

With the foregoing and other objects in view there is further provided, in accordance with the invention, a test configuration. The test configuration contains an automatic test machine having connections for supplying poles of a supply voltage, further connections for supplying signals containing a plurality of states, and a test connection for supplying an impressed voltage. An integrated circuit is provided and contains first connection areas connected to the automatic test machine for receiving the poles of the supply voltage. A switch having a first input for receiving a test signal for actuating the switch so that the switch is on in a test mode and off during a normal mode, is provided. The switch has a second input for receiving the test voltage and an output. A second connection area having a first terminal is connected exclusively to the second input of the switch and a second terminal connected to the test connection for receiving the impressed voltage. A functional unit having elements that can be irreversibly switched by impressing the impressed voltage, is provided. The functional unit has an input connected to the output of the switch for receiving the impressed voltage.

Other features which are considered as characteristic for the invention are set forth in the appended claims.

Although the invention is illustrated and described herein as embodied in an integrated circuit with a test mode, and a test configuration for testing the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a block diagram of an automatic test machine connected to an integrated circuit according to the invention.

DESCRIPTION OF THE PREFERRED EMBODIMENTS

Figure 1:
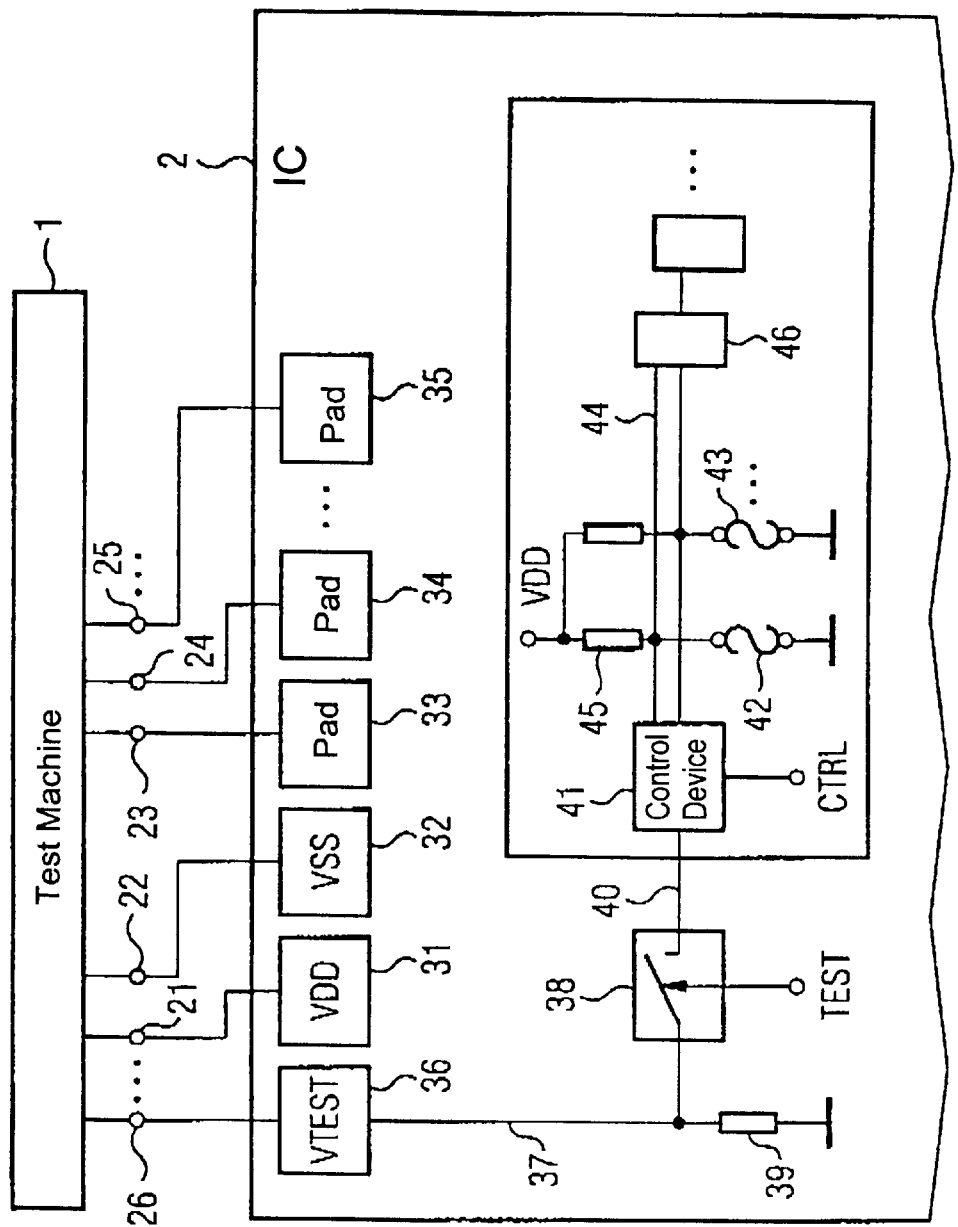

Referring now to the single figure of the drawing in detail, there is shown an automatic test machine 1 and an integrated semiconductor circuit 2 that is to be tested. The semiconductor circuit 2 has connection areas, so-called pads 31–36, which can be used to supply the signals to the semiconductor chip. The pads 31–36 are two-dimensional metallized areas that can be accessed from the surface of the chip. A bonding wire punched onto the pads 31–36 is used to connect each pad to a connection pin that is fitted on the package and can be accessed from outside the package. The integrated circuit 2 has one (or more) pads 31 for a positive pole VDD of the supply voltage and one (or more) pads 32 for supplying a negative pole VSS of the supply voltage (ground). The pads 31, 32 are used to supply the integrated semiconductor circuit 2 with an operating voltage during normal operation. Furthermore, a multiplicity of signal pads 33, 34, 35 are provided which can be used to supply and tap off operating signals which alternate the signal state. The signal levels for high and low level states are the same in each case for the signals routed via the pads 33, 34, 35.

In addition, the pad 36 is provided. The pad 36 is connected to a switching device 38 by a single line 37. The switching device 38 can be controlled by a signal TEST that indicates that the integrated circuit 2 is in the test state. By way of example, the signal TEST is produced by a specially coded signal train using the operating signals input at the pads 33, 34, 35. When the signal TEST has been activated, the switching device 38 is on and forms a conductive path through which an impressed or test voltage on the pad 36 is forwarded via the line 37 into the circuit interior of the integrated circuit 2. The pad 36 has no further connection apart from to the line 37. In particular, the pad 36 is not additionally used for inputting operating signals, like the pads 33, 34, 35. The pad 36 is used exclusively just for supplying the impressed voltage VTEST. During the test on the integrated circuit 2, the impressed voltage VTEST is forwarded to the interior of the circuit. During normal operation, which is in progress otherwise, the switch 38 is off, which results in that any signal input at the pad 36 is discharged to ground via a pull-down resistor 39. In the exemplary embodiment shown, the impressed voltage VTEST which can be input via the pad 36 needs to be proportioned such that it is higher with respect to a reference-ground voltage VSS than the operating supply potential VDD.

In the test mode, an output line 40 of the switch 38 is supplied with an elevated operating voltage, the impressed voltage VTEST. The elevated operating voltage is used in order to program irreversibly switchable switches 42, 43, so-called fuses. In the initial state, a fuse forms a conductive connection, so that a line 44 connected to the fuse 42 is connected to ground. If a voltage situated outside the normal operating voltage, for example having a level of 6 volts or above, is applied to the fuse 42 for a sufficient length of time, the fuse 42 is severed. The line 44 is also connected to the positive supply potential VDD via a pull-up resistor 45. The line 44 drives an input of a register cell 46, which performs other switching operations in the integrated circuit. By way of example, an output signal from the register cell 46 is used to replace faulty memory cells with redundant memory cells. In order to connect the elevated voltage VTEST that is input via the pad 36 to a respective fuse 42, 43 at the correct time, a test control device 41 is provided which is controlled by a control signal CTRL, containing a plurality of bits, on the basis of the fault information and redundancy information.

The automatic test machine 1 has connections 21, . . . , 26 associated with the respective pads or connections 31, . . . , 36. The connections 21, 22 are in a form such that they provide the supply voltage of any desired, individually settable level at low impedance. The connections 23, 24, 25 provide the operating signals which can be set, in terms of the level of the signal levels, only on a group basis. It is worth noting that the pad 36 for the programming voltage is connected to an additional supply voltage connection 26, comparable to the connections 21, 22, of the automatic test machine 1. The connection 26 can be configured individually and in any desired manner in terms of the supply voltage which it can provide.

Consequently, with the prerequisite that the pad 36 would be unconnected and without any function during normal operation, a solution is provided which allows provision of the impressed voltage VTEST being different than the operating voltage with little complexity in the test mode.

I claim:
1. An integrated circuit, comprising:
    first connection areas each connecting to one of two poles of a supply voltage;
    a switch having a first input receiving a test signal for actuating said switch so that said switch is on in a test mode and off during a normal mode, said switch having a second input for receiving an impressed voltage and an output;
    a second connection area connected exclusively to said switch and providing the impressed voltage; and
    a functional unit having elements which can be irreversibly switched by impressing the impressed voltage, said functional unit having an input connected to said output of said switch for receiving the impressed voltage.
2. The integrated circuit according to claim 1, wherein one of said elements forms a conducting current path in an initial state and forms an unloaded current path when the impressed voltage has been impressed.
3. The integrated circuit according to claim 1, wherein the impressed voltage required for irreversibly switching said elements is different than the supply voltage.
4. The integrated circuit according to claim 3, wherein a magnitude of the impressed voltage is greater than that of the supply voltage.
5. A test configuration, comprising:
    an automatic test machine having connections for supplying poles of a supply voltage, further connections for supplying signals containing a plurality of states, and a test connection for supplying an impressed voltage; and
    an integrated circuit, containing:
        first connection areas connected to said automatic test machine for receiving the poles of the supply voltage;
        a switch having a first input for receiving a test signal for actuating said switch so that said switch is on in a test mode and off during a normal mode, said switch having a second input for receiving the test voltage and an output;
        a second connection area having a first terminal connected exclusively to said second input of said switch and a second terminal connected to said test connection for receiving the impressed voltage; and
        a functional unit having elements which can be irreversibly switched by impressing the impressed voltage, said functional unit having an input connected to said output of said switch for receiving the impressed voltage.

* * * * *